(12) United States Patent
Shin et al.

(10) Patent No.: US 11,615,847 B2
(45) Date of Patent: Mar. 28, 2023

(54) MEMORY DEVICE AND OPERATING METHOD OF THE MEMORY DEVICE

(71) Applicant: SK hynix Inc., Icheon-si (KR)

(72) Inventors: Jae Hyeon Shin, Icheon-si (KR); In Gon Yang, Icheon-si (KR); Sungmook Lim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 119 days.

(21) Appl. No.: 17/183,182

(22) Filed: Feb. 23, 2021

(65) Prior Publication Data

US 2022/0059167 A1   Feb. 24, 2022

(30) Foreign Application Priority Data

Aug. 20, 2020 (KR) .................. 10-2020-0104939

(51) Int. Cl.
*G11C 11/00* (2006.01)
*G11C 16/10* (2006.01)
*G11C 16/08* (2006.01)
*G11C 16/04* (2006.01)

(52) U.S. Cl.
CPC .......... *G11C 16/10* (2013.01); *G11C 16/0483* (2013.01); *G11C 16/08* (2013.01)

(58) Field of Classification Search
CPC ..... G11C 16/10; G11C 16/0483; G11C 16/32; G11C 11/4094; G11C 16/08; G11C 16/24; G11C 1/4096; G11C 11/4093; G11C 11/4097; G11C 16/30; G11C 8/08
See application file for complete search history.

(56) References Cited

U.S. PATENT DOCUMENTS

| | | | | |
|---|---|---|---|---|
| 8,675,416 B2* | 3/2014 | Lee | ................... | G11C 16/3459 |
| | | | | 365/185.22 |
| 9,691,486 B2* | 6/2017 | Kim | ................. | G11C 16/12 |
| 2006/0209592 A1* | 9/2006 | Li | ................... | G11C 11/5642 |
| | | | | 365/185.03 |
| 2007/0171711 A1* | 7/2007 | Kang | ................ | G11C 11/5642 |
| | | | | 365/185.03 |
| 2011/0280083 A1* | 11/2011 | Choi | ................. | G11C 16/3454 |
| | | | | 365/185.22 |

FOREIGN PATENT DOCUMENTS

| KR | 1020110120467 A | 11/2011 |
|---|---|---|
| KR | 1020130107557 A | 10/2013 |

\* cited by examiner

*Primary Examiner* — Hien N Nguyen
(74) *Attorney, Agent, or Firm* — William Park & Associates Ltd.

(57) ABSTRACT

A memory device includes a plurality of memory cell strings, a peripheral circuit, and control logic. The plurality of memory cell strings are connected between a bit line and a common source line. The peripheral circuit is configured to perform a channel precharge operation and a program operation for the plurality of memory cell strings. The control logic is configured to control the peripheral circuit to apply a pass voltage to a selected word line among a plurality of word lines connected to the plurality of memory cell strings and to apply a turn-on voltage to a source select line connected to the plurality of memory cell strings, during a portion of a period in which the pass voltage is applied to the selected word line, in the program operation.

20 Claims, 14 Drawing Sheets

MEMORY DEVICE AND OPERATING METHOD OF THE MEMORY DEVICE

CROSS-REFERENCE TO RELATED APPLICATION

The present application claims priority under 35 U.S.C. § 119(a) to Korean patent application number 10-2020-0104939 filed on Aug. 20, 2020, in the Korean Intellectual Property Office, the entire disclosure of which is incorporated by reference herein.

BACKGROUND

1. Technical Field

The present disclosure generally relates to an electronic device, and more particularly, to a memory device and an operating method of the memory device.

2. Related Art

A storage device is a device which stores data under the control of a host device such as a computer or a smart phone. The storage device may include a memory device for storing data and a memory controller for controlling the memory device. The memory device is classified into a volatile memory device and a nonvolatile memory device.

The volatile memory device is a memory device in which data is stored only when power is supplied, and stored data disappears when the supply of power is interrupted. The volatile memory device may include a Static Random Access Memory (SRAM), a Dynamic Random Access Memory (DRAM), and the like.

The nonvolatile memory device is a memory device in which data does not disappear even when the supply of power is interrupted. The nonvolatile memory device may include a Read Only Memory (ROM), a Programmable ROM (PROM), an Electrically Programmable ROM (EPROM), an Electrically Erasable ROM (EEROM), a flash memory, and the like.

SUMMARY

In accordance with an aspect of the present disclosure, there may be provided a method for operating a memory device including a plurality of memory cell strings connected between a bit line and a common source line, the method including: applying a pass voltage to a selected word line among a plurality of word lines connected to the plurality of memory cell strings; and applying a turn-on voltage to a source select line connected to the plurality of memory cell strings, during a portion of a period in which the pass voltage is applied to the selected word line.

In accordance with another aspect of the present disclosure, there may be provided a memory device including: a plurality of memory cell strings connected between a bit line and a common source line; a peripheral circuit configured to perform a channel precharge operation and a program operation for the plurality of memory cell strings; and a control logic configured to control the peripheral circuit to apply a pass voltage to a selected word line among a plurality of word lines connected to the plurality of memory cell strings and to apply a turn-on voltage to a source select line connected to the plurality of memory cell strings, during a portion of a period in which the pass voltage is applied to the selected word line, in the program operation.

BRIEF DESCRIPTION OF THE DRAWINGS

Examples of embodiments will now be described more fully hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Embodiments provide a memory device having improved channel voltage drop prevention performance and an operating method of the memory device.

Figure 1:
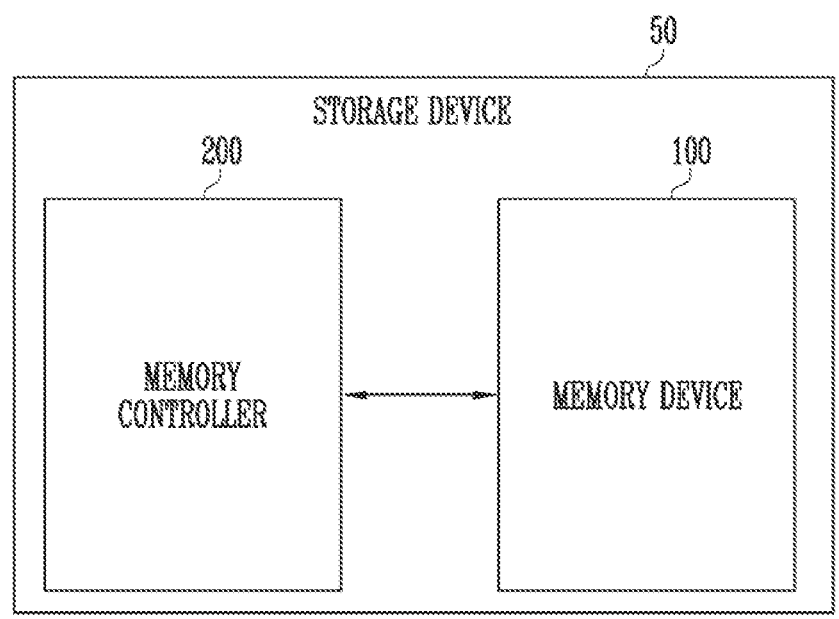
FIG. 1 is a diagram illustrating a storage device in accordance with an embodiment of the present disclosure.

FIG. 1 is a diagram illustrating a storage device in accordance with an embodiment of the present disclosure.

Referring to FIG. 1, the storage device 50 may include a memory device 100 and a memory controller 200 configured to control an operation of the memory device 100. The storage device 50 may be a device for storing data under the control of a host, such as a mobile phone, a smart phone, an MP3 player, a laptop computer, a desktop computer, a game console, a TV, a tablet PC or an in-vehicle infotainment.

The storage device 50 may be manufactured as any one of various types of storage devices according to a host interface that is a communication scheme with the host. For example, the storage device 50 may be implemented with any one of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 50 may be manufactured as any one of various kinds of package types. For example, the storage device 50 may be manufactured as any one of various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 operates under the control of the memory controller 200. The memory device 100 may include a memory cell array including a plurality of memory cells for storing data.

Each of the memory cells may be configured as a Single Level Cell (SLC) storing one data bit, a Multi-Level Cell (MLC) storing two data bits, a Triple Level Cell (TLC) storing three data bits, or a Quad Level Cell (QLC) storing four data bits.

The memory cell array may include a plurality of memory blocks. Each memory block may include a plurality of memory cells. One memory block may include a plurality of pages. In an embodiment, the page may be a unit for storing data in the memory device 100 or reading data stored in the memory device 100.

The memory block may be a unit for erasing data. In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, for convenience of description, a case where the memory device 100 is a NAND flash memory is assumed and described.

The memory device 100 receives a command and an address from the memory controller 200 and accesses an area selected by the address in the memory cell array. That is, the memory device 100 may perform an operation instructed by the command on the area selected by the address. For example, the memory device 100 may perform a write (program) operation, a read operation, and an erase operation. In the program operation, the memory device 100 may program data in the area selected by the address. In the read operation, the memory device 100 may read data from the area selected by the address. In the erase operation, the memory device 100 may erase data stored in the area selected by the address.

The memory controller 200 may control overall operations of the storage device 50.

When power is applied to the storage device 50, the memory controller 200 may execute firmware (FW). When the memory device 100 is a flash memory device, the memory controller 200 may execute FW such as a Flash Translation Layer (FTL) for controlling communication between the host and the memory device 100.

In an embodiment, the memory controller 200 may receive data and a Logical Block Address (LBA) from the host, and translate the LBA into a Physical Block Address (PBA) representing addresses of memory cells included in the memory device 100, in which data is to be stored.

The memory controller 200 may control the memory device 100 to perform a program operation, a read operation, an erase operation, or the like in response to a request from the host. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may autonomously generate a command, an address, and data regardless of any request from the host, and transmit the command, the address, and the data to the memory device 100. For example, the memory controller 200 may provide the command, the address, and the data to the memory device 100 to perform background operations such as a program operation for wear leveling and a program operation for garbage collection.

In an embodiment, the memory controller 200 may control at least two memory devices 100. The memory controller 200 may control the memory devices according to an interleaving scheme to improve operational performance. The interleaving scheme may be an operating scheme that allows operation periods of at least two memory devices 100 to overlap with each other.

The host may communicate with the storage device 50, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
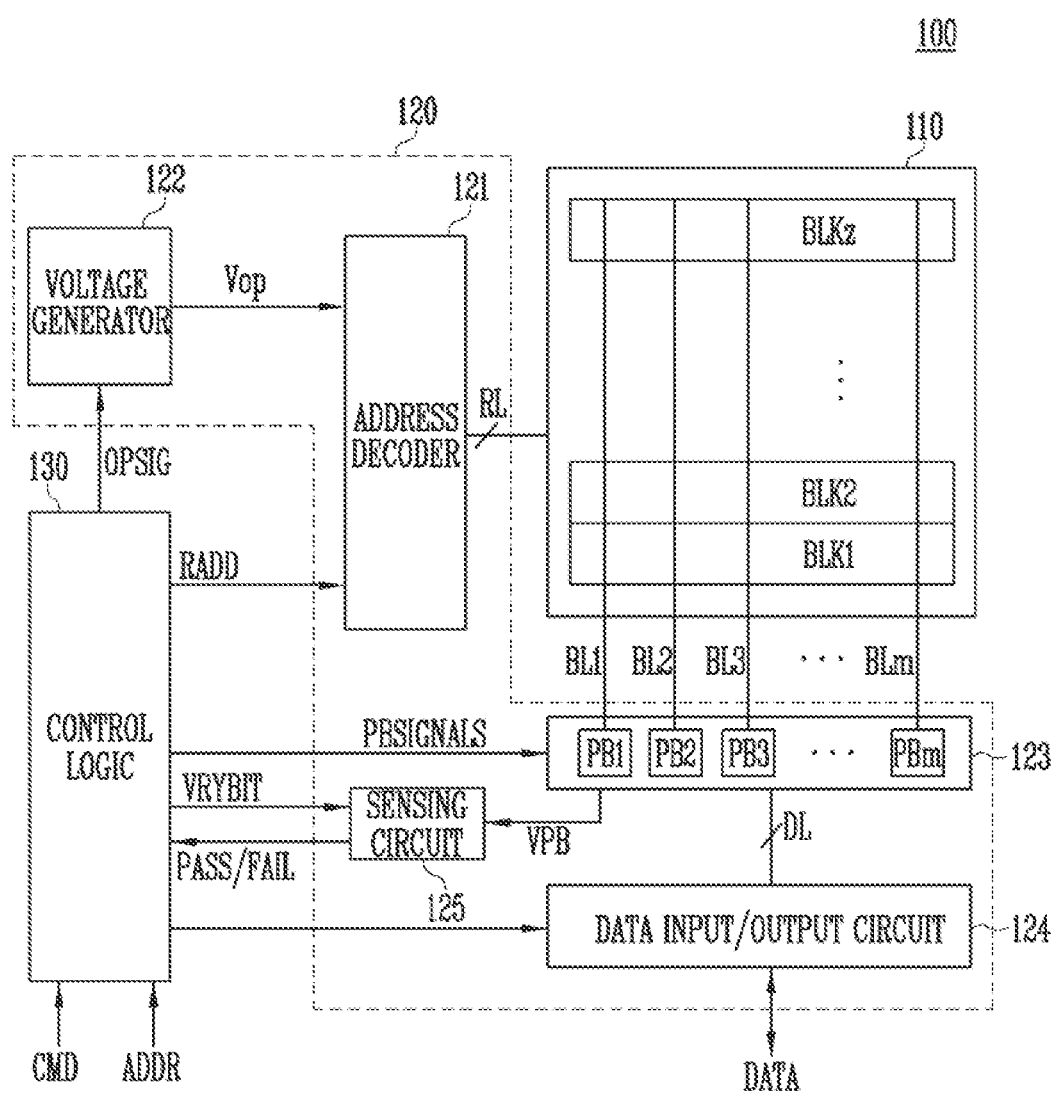
FIG. 2 is a diagram illustrating a structure of a memory device shown in FIG. 1.

FIG. 2 is a diagram illustrating a structure of the memory device shown in FIG. 1.

Referring to FIG. 2, the memory device 100 may include a memory cell array 100, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to an address decoder 121 through row lines RL. The plurality of memory blocks BLK1 to BLKz are connected to a read/write circuit 123 through bit lines BL1 to BLm. Each of the plurality of memory blocks BLK1 to BLKz includes a plurality of memory cells. In an embodiment, the plurality of memory cells may be nonvolatile memory cells. Memory cells connected to the same word line among the plurality of memory cells may be defined as one physical page. That is, the memory cell array 110 may be configured with a plurality of physical pages. In accordance with an embodiment of the present disclosure, each of the plurality of memory blocks BLK1 to BLKz included in the memory cell array 110 may include a plurality of dummy cells. One or more dummy cells may be connected in series between a drain select transistor and memory cells and between a source select transistor and the memory cells.

Each of the memory cells of the memory device may be configured as a Single Level Cell (SLC) storing one data bit, a Multi-Level Cell (MLC) storing two data bits, a Triple Level Cell (TLC) storing three data bits, or a Quad Level Cell (QLC) storing four data bits.

The peripheral circuit 120 may include the address decoder 121, a voltage generator 122, the read/write circuit 123, a data input/output circuit 124, and a sensing circuit 125.

The peripheral circuit 120 drives the memory cell array 110. For example, the peripheral circuit 120 may drive the memory cell array 110 to perform a program operation, a read operation, and an erase operation.

The address decoder 121 is connected to the memory cell array 110 through the row lines RL. The row lines RL may include drain select lines, word lines, source select lines, and a common source line. In accordance with an embodiment of the present disclosure, the word lines may include normal word lines and dummy word lines. In accordance with an embodiment of the present disclosure, the row lines RL may further include a pipe select line.

The address decoder 121 may operate under the control of the control logic 130. The address decoder 121 receives an address ADDR from the control logic 130.

The address decoder 121 may decode a block address in the received address ADDR. The address decoder 121 selects at least one memory block among the memory blocks BLK1 to BLKz according to the decoded block address. The address decoder 121 may decode a row address in the received address ADDR. The address decoder 121 may select at least one word line among word lines of a memory block according to the decoded row address. The address decoder 121 may apply an operating voltage Vop supplied from the voltage generator 122 to the selected word line.

In a program operation, the address decoder 121 may apply a program voltage to the selected word line, and apply a pass voltage having a level lower than that of the program voltage to unselected word lines. In a program verify operation, the address decoder 121 may apply a verify voltage to the selected word line, and apply a verify pass voltage having a level higher than that of the verify voltage to the unselected word lines.

In a read operation, the address decoder 121 may apply a read voltage to the selected word line, and apply a read pass voltage having a level higher than that of the read voltage to the unselected word lines.

In accordance with an embodiment of the present disclosure, an erase operation of the memory device 100 is performed in units of memory blocks. In an erase operation, the address ADDR input to the memory device 100 includes a block address. The address decoder 121 may decode the block address and select at least memory block according to the decoded block address. In the erase operation, the address decoder 121 may apply a ground voltage to word lines connected to the selected memory block.

In accordance with an embodiment of the present disclosure, the address decoder 121 may decode a column address in the address ADDR transmitted thereto. The decoded column address may be transmitted to the read/write circuit 123. In an example, the address decoder 121 may include components such as a row decoder, a column decoder, and an address buffer.

The voltage generator 122 may generate a plurality of operating voltages Vop by using an external power voltage supplied to the memory device 100. The voltage generator 122 operates under the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of operating voltages Vop by using the external power voltage or the internal power voltage. The voltage generator 122 may generate various voltages required by the memory device 100. For example, the voltage generator 122 may generate a plurality of erase voltages, a plurality of program voltages, a plurality of pass voltages, a plurality of select read voltages, and a plurality of unselect read voltages.

In order to generate a plurality of operating voltages Vop having various voltage levels, the voltage generator 122 may include a plurality of pumping capacitors for receiving the internal power voltage, and generate the plurality of operating voltages Vop by selectively activating the plurality of pumping capacitors under the control of the control logic 130.

The plurality of generated voltages Vop may be supplied to the memory cell array 110 by the address decoder 121.

The read/write circuit 123 includes first to mth page buffers PB1 to PBm. The first to mth page buffers PB1 to PBm are connected to the memory cell array 110 through the respective first to mth bit lines BL1 to BLm. The first to mth page buffers PB1 to PBm operate under the control of the control logic 130.

The first to mth page buffers PB1 to PBm communicate data DATA with the data input/output circuit 124. In a program operation, the first to mth page buffers PB1 to PBm receive data DATA to be stored through the data input/output circuit 124 and data lines DL.

In a program operation, the first to mth page buffers PB1 to PBm may transfer, to selected memory cells through the bit lines BL1 to BLm, data DATA received through the data input/output circuit 124 when a program pulse is applied to a selected word line. The memory cells of the selected memory cells are programmed according to the transferred data DATA. A memory cell connected to a bit line through which a program allow voltage (e.g., a ground voltage) is applied may have an increased threshold voltage. A threshold voltage of a memory cell connected to a bit line through which a program inhibit voltage (e.g., a power voltage) is applied may be maintained. In a program verify operation, the first to mth page buffers PB1 to PBm read data DATA stored in the selected memory cells from the selected memory cells through the bit lines BL1 to BLm.

In a read operation, the read/write circuit 123 may read data DATA from memory cells of a selected page through the bit lines BL, and store the read data DATA in the first to mth page buffers PB1 to PBm.

In an erase operation, the read/write circuit 123 may float the bit lines BL. In an embodiment, the read/write circuit 123 may include a column select circuit.

The data input/output circuit 124 is connected to the first to mth page buffers PB1 to PBm through the data lines DL. The data input/output circuit 124 operates under the control of the control logic 130.

The data input/output circuit 124 may include a plurality of input/output buffers (not shown) that receive input data DATA. In a program operation, the data input/output circuit 124 may receive data DATA to be stored from an external controller (not shown). In a read operation, the data input/output circuit 124 outputs, to the external controller, data transmitted from the first to mth page buffers PB1 to PBm included in the read/write circuit 123.

In a read operation or verify operation, the sensing circuit 125 may generate a reference current in response to an allow bit VRYBIT signal generated by the control logic 130, and output a pass signal or fail signal to the control logic 130 by comparing a sensing voltage VPB received from the read/write circuit 123 and a reference voltage generated by the reference current.

The control logic 130 may be connected to the address decoder 121, the voltage generator 122, the read/write circuit 123, the data input/output circuit 124, and the sensing circuit 125. The control logic 130 may control overall operations of the memory device 100. The control logic 130 may operate in response to a command CMD transferred from an external device.

The control logic 130 may control the peripheral circuit 120 by generating several signals in response to a command CMD and an address ADDR. For example, the control logic 130 may generate an operation signal OPSIG, a row address RADD, a read/write circuit control signal PBSIGNALS, and an allow bit VRYBIT in response to the command CMD and the address ADDR. The control logic 130 may output the operation signal OPSIG to the voltage generator 122, output the row address RADD to the address decoder 121, output the read/write circuit control signal PBSIGNALS to the read/write circuit 123, and output the allow bit VRYBIT to the sensing circuit 125. Also, the control logic 130 may determine whether the verify operation has passed or failed in response to the pass or fail signal PASS/FAIL output by the sensing circuit 125.

In an embodiment, the memory cell array 110 may include a plurality of memory cell strings. As will be described later in FIGS. 3 to 6, the memory cell string may include a drain select transistor connected to a bit line, a source select transistor connected to a common source line, and a plurality of memory cells. The plurality of memory cells may be connected between the drain select transistor and the source select transistor.

In an embodiment, as will be described later in FIGS. 7 and 8, the peripheral circuit 120 may perform a channel precharge operation, a program operation, and a program verify operation on the plurality of memory cell strings.

The control logic 130 may control the peripheral circuit 120 to apply a pass voltage to a selected word line among a plurality of word lines connected to the plurality of memory cell strings in the program operation. The control logic 130 may control the peripheral circuit 120 to apply a turn-on voltage to a source select line connected to the plurality of memory cell strings during a portion of a period in which the pass voltage is applied to the selected word line.

The control logic 130 may control the peripheral circuit 120 to apply a ground voltage to the source select line after a period in which the turn-on voltage is applied to the source select line in the period in which the pass voltage is applied to the selected word line. The control logic 130 may control the peripheral circuit 120 to apply turn-on voltage to a drain select line connected to a selected memory cell string among the plurality of memory cell strings, after the ground voltage is applied to the source select line. The turn-on voltage may be a voltage for turning on the drain select transistor connected to the drain select line or the source select transistor connected to the source select line.

The control logic 130 may control the peripheral circuit 120 to apply a precharge voltage to the common source line in the channel precharge operation. The control logic 130 may control the peripheral circuit 120 to apply the turn-on voltage to the source select line.

The control logic 130 may control the peripheral circuit 120 to apply a word line voltage to the selected word line during a portion of a period in which the precharge voltage is applied to the common source line. The word line voltage may be higher than or equal to the ground voltage and be lower than the pass voltage.

In an embodiment, the control logic 130 may control the peripheral circuit 120 to apply the turn-on voltage to the source select line while the precharge voltage is being applied to the common source line.

In an embodiment, the control logic 130 may control the peripheral circuit 120 to apply a first turn-on voltage to the source select line during a period in which the word line voltage is applied to the selected word line in the period in which the precharge voltage is applied to the common source line. The control logic 130 may control the peripheral circuit 120 to apply a second turn-on voltage during the other period except the period in which the word line voltage is applied to the selected word line in the period in which the precharge voltage is applied to the common source line. The second turn-on voltage may be lower than the first turn-on voltage.

The control logic 130 may control the peripheral circuit 120 to apply a program voltage after the pass voltage is applied to the selected word line in the program operation.

Figure 3:
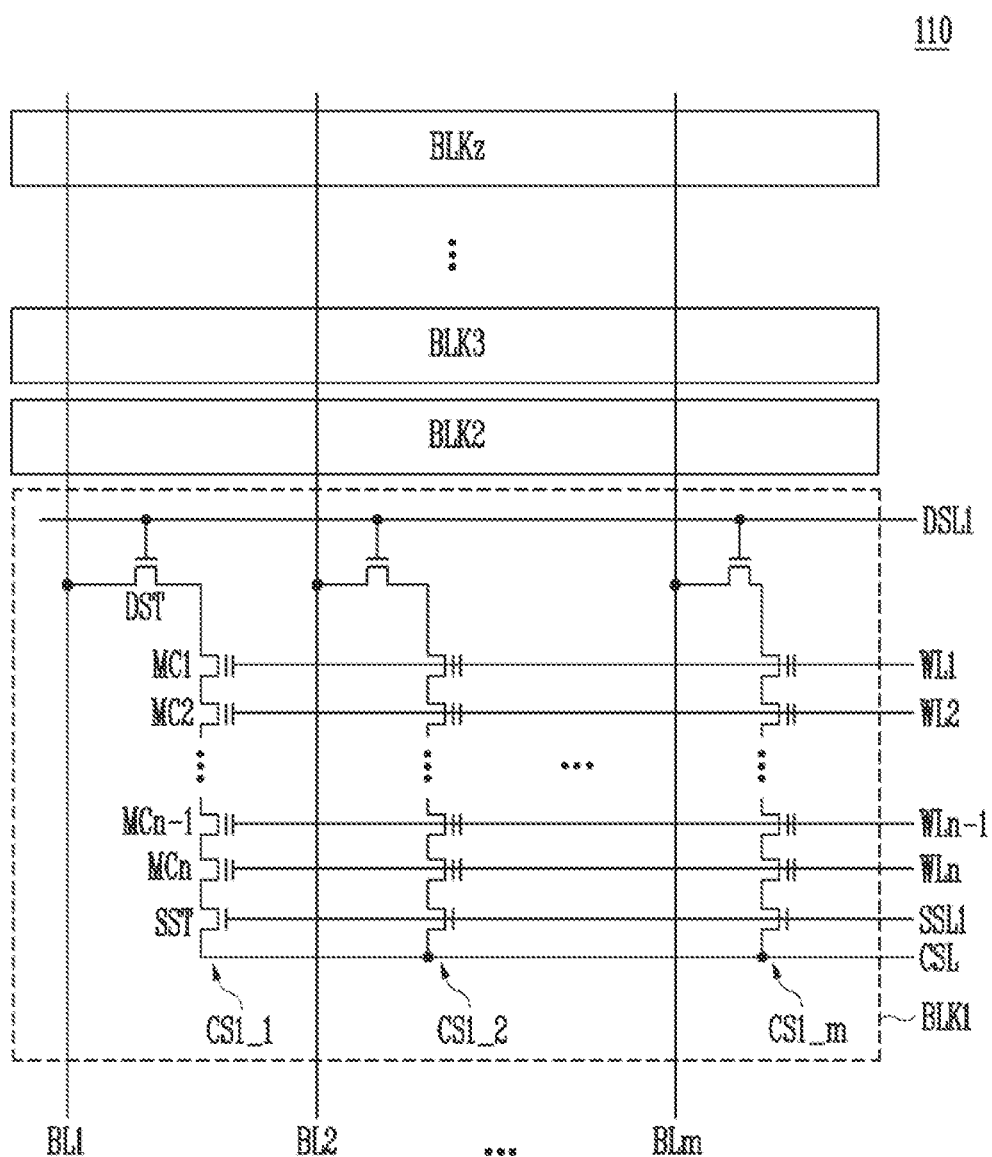
FIG. 3 is a diagram illustrating an embodiment of a memory cell array shown in FIG. 2.

FIG. 3 is a diagram illustrating an embodiment of the memory cell array shown in FIG. 2.

Referring to FIG. 3, first to zth memory blocks BLK1 to BLKz are commonly connected to the first to mth bit lines BL1 to BLm. In FIG. 3, for convenience of description, components included in the first memory block BLK1 among the plurality of memory blocks BLK1 to BLKz are illustrated, and components included in each of the other memory blocks BLK2 to BLKz are omitted. It will be understood that each of the other memory blocks BLK2 to BLKz is configured identically to the first memory block BLK1.

The memory block BLK1 may include a plurality of cell strings CS1_1 to CS1_$m$ ($m$ is a positive integer). First to mth cell strings CS1_1 to CS1_$m$ are respectively connected to the first to mth bit lines BL1 to BLm. Each of the first to mth cell strings CS1_1 to CS1_$m$ includes a drain select transistor DST, a plurality of memory cells MC1 to MCn ($n$ is a positive integer) connected in series, and a source select transistor SST.

A gate terminal of the drain select transistor DST included in each of the first to mth cell strings CS1_1 to CS1_$m$ is connected to a drain select line DSL1. Gate terminals of first to nth memory cells MC1 to MCn included in each of the first to mth cell strings CS1_1 to CS1_$m$ are respectively connected to first to nth word lines WL1 to WLn. A gate terminal of the source select transistor SST included in each of the first to mth cell strings CS1_1 to CS1_m is connected to a source select line SSL1.

For convenience of description, a structure of a cell string will be described based on the first cell string CS1_1 among the plurality of cell strings CS1_1 to CS1_m. However, it will be understood that each of the other cell strings CS1_2 to CS1_m is configured identically to the first cell string CS1_1.

A drain terminal of the drain select transistor DST included in the first cell string CS1_1 is connected to the first bit line BL1. A source terminal of the drain select transistor DST included in the first cell string CS1_1 is connected to a drain terminal of the first memory cell MC1 included in the first cell string CS1_1. The first to nth memory cells MC1 to MCn are connected in series to each other. A drain terminal of the source select transistor SST included in the first cell string CS1_1 is connected to a source terminal of the nth memory cell MCn included in the first cell string CS1_1. A source terminal of the source select transistor SST included in the first cell string CS1_1 is connected to a common source line CSL. In an embodiment, the common source line CSL may be commonly connected to the first to zth memory blocks BLK1 to BLKz.

The drain select line DSL1, the first to nth word lines WL1 to WLn, and the source select line SSL1 are included in the row lines RL shown in FIG. 2. The drain select line DSL1, the first to nth word lines WL1 to WLn, and the source select line SSL1 is controlled by the address decoder 121 shown in FIG. 2. The common source line CSL may be controlled by the control logic 130 shown in FIG. 2. The first to mth bit lines BL1 to BLm are controlled by the read/write circuit 123 shown in FIG. 2.

Figure 4:
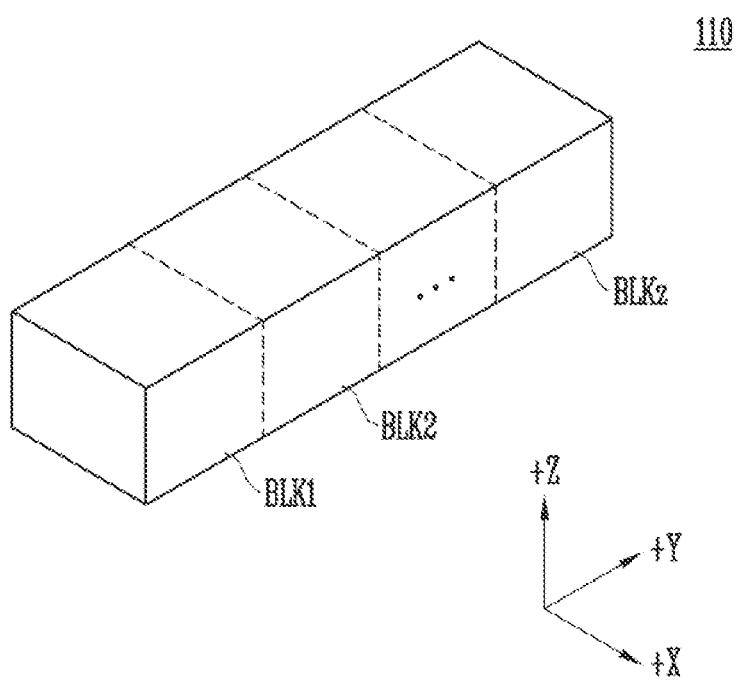
FIG. 4 is a diagram illustrating another embodiment of the memory cell array shown in FIG. 2.

FIG. 4 is a diagram illustrating another embodiment of the memory cell array shown in FIG. 2.

Referring to FIG. 4, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block will be described in more detail with reference to FIGS. 5 and 6.

Figure 5:
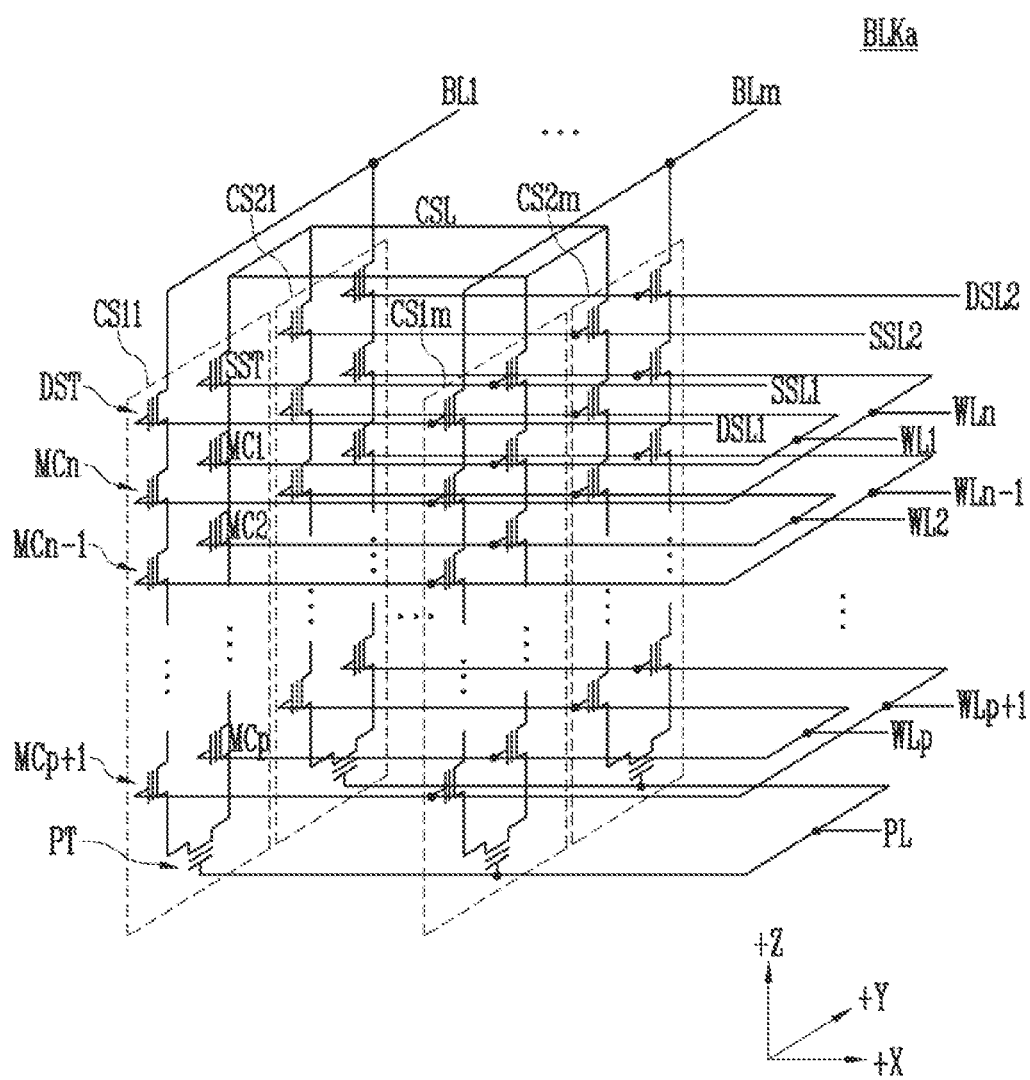
FIG. 5 is a circuit diagram illustrating any one memory block among memory blocks shown in FIG. 4.

FIG. 5 is a circuit diagram illustrating any one memory block BLKa among the memory blocks BLK1 to BLKz shown in FIG. 4.

Referring to FIG. 5, the memory block BLKa may include a plurality of cell strings CS11 to CS1m and CS21 to CS2m. In an embodiment, each of the plurality of cell strings CS11 to CS1m and CS21 to CS2m may be formed in a 'U' shape. In the memory block BLKa, m cell strings are arranged in a row direction (i.e., a +X direction). FIG. 5 illustrates two cell strings arranged in a column direction (i.e., a +Y direction). However, this is for convenience of description, and it will be understood that three cell strings may be arranged in the column direction.

In an embodiment, one memory block may include a plurality of sub-blocks. One sub-block may include cell strings arranged in a 'U' shape on one column.

Each of the plurality of cell strings CS11 to CS1m and CS21 to CS2m may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is connected between a common source line CSL and memory cells MC1 to MCp.

In an embodiment, the source select transistors of cell strings arranged on the same row are connected to one source select line extending in the row direction, and the source select transistors of cell strings arranged on different rows are connected to different source select lines. In FIG. 5, the source select transistors of the cell strings CS11 to CS1m on a first row are connected to a first source select line SSL1. The source select transistors of the cell strings CS21 to CS2m on a second row are connected to a second source select line SSL2.

In another embodiment, the source select transistors of the cell strings CS11 to CS1m and CS21 to CS2m may be commonly connected to one source select line.

The first to nth memory cells MC1 to MCn of each cell string are connected between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are connected in series between the source select transistor SST and the pipe transistor PT. The (p+1)th to nth memory cells MCp+1 to MCn are sequentially arranged in the +Z direction, and are connected in series between the pipe transistor PT and the drain select transistor DST. The first to pth memory cells MC1 to MCp and the (p+1)th to nth memory cells MCp+1 to MCn are connected through the pipe transistor PT. Gate electrodes of the first to nth memory cells MC1 to MCn of each cell string are connected to first to nth word lines WL1 to WLn, respectively.

A gate of the pipe transistor PT of each cell string is connected to a pipe line PL.

The drain select transistor DST of each cell string is connected between a corresponding bit line and the memory cells MCp+1 to MCn. Cell strings arranged in the same row are connected to one drain select line extending in the row direction. The drain select transistors of the cell strings CS11 to CS1m on the first row are connected to a first drain select line DSL1. The drain select transistors of the cell strings CS21 to CS2m on the second row are connected to a second drain select line DSL2.

Cell strings arranged in the same column are connected to one bit line extending in the column direction. In FIG. 5, the cell strings CS11 and CS21 on a first column are connected to a first bit line BL1. The cell strings CS1m and CS2m on an mth column are connected to an mth bit line BLm.

Memory cells connected to the same word line in the cell strings arranged in the same row constitute one page. For example, memory cells connected to the first word line WL1 in the cell strings CS11 to CS1m on the first row constitute one page. Memory cells connected to the first word line WL1 in the cell strings CS21 to CS2m on the second row constitute another page. As any one of the drain select lines DSL1 and DSL2 is selected, cell strings arranged in one row may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1m or CS21 to CS2m arranged in the row direction may be connected to the even bit lines, respectively, and odd-numbered cell strings among the cell strings CS11 to CS1m or CS21 to CS2m arranged in the row direction may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be deteriorated.

In order to efficiently control the at least one dummy memory cell, the dummy memory cells may have a required threshold voltage. Before or after an erase operation of the memory block BLKa, a program operation may be performed on all or some of the dummy memory cells. When an erase operation is performed after the program operation is performed, the threshold voltage of the dummy memory cells control a voltage applied to the dummy word lines connected to the respective dummy memory cells, so that the dummy memory cells can have the required threshold voltage.

Figure 6:
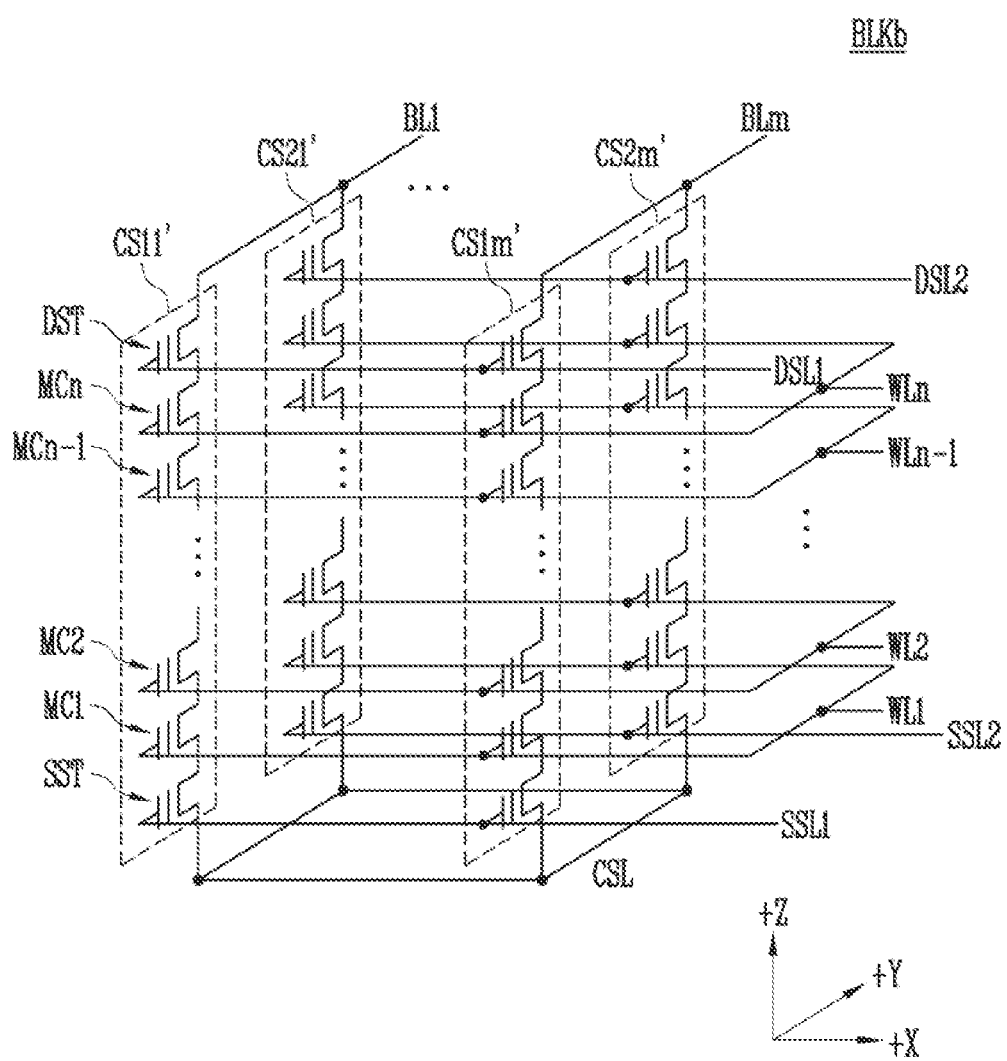
FIG. 6 is a circuit diagram illustrating another embodiment of the one memory block among the memory blocks shown in FIG. 4.

FIG. 6 is a circuit diagram illustrating another embodiment BLKb of the one memory block among the memory blocks BLK1 to BLKz shown in FIG. 4.

Referring to FIG. 6, the memory block BLKb may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

In an embodiment, one memory block may include a plurality of sub-blocks. One sub-block may include cell strings arranged in an 'I' shape on one column.

The source select transistor SST of each cell string is connected between a common source line CSL and the memory cells MC1 to MCn. The source select transistors of cell strings arranged on the same row are connected to the same source select line. The source select transistors of the cell strings CS11' to CS1m' arranged on a first row are connected to a first source select line SSL1. Source select transistors of the cell strings CS21' to CS2m' arranged on a second row are connected to a second source select line SSL2. In another embodiment, the source select transistors of the cell strings CS11' to CS1m' and CS21' to CS2m' may be commonly connected to one source select line.

The first to nth memory cells MC1 to MCn of each cell string are connected in series between the source select transistor SST and the drain select transistor DST. Gate electrodes of the first to nth memory cells MC1 to MCn are connected to first to nth word lines WL1 to WLn, respectively.

The drain select transistor DST of each cell string is connected between a corresponding bit line and the memory cells MC1 to MCn. The drain select transistors of cell strings arranged in the same row are connected to one drain select line extending in the row direction. The drain select transistors of the cell strings CS11' to CS1m' on the first row are connected to a first drain select line DSL1. The drain select transistors of the cell strings CS21' to CS2m' on the second row are connected to a second drain select line DSL2.

Consequently, the memory block BLKb of FIG. 6 has a circuit similar to that of the memory block BLKa of FIG. 5, except that the pipe transistor PT is excluded from each cell string in FIG. 6.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be connected to the even bit lines, respectively, and odd-numbered cell strings among the cell strings CS11' to CS1m' or CS21' to CS2m' arranged in the row direction may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCn. Alternatively, the at least one dummy memory cell may be provided to decrease an electric field between the drain select transistor DST and the memory cells MC1 to MCn. When the number of dummy memory cells increases, the reliability of an operation of the memory block BLKb is improved. On the other hand, the size of the memory block BLKb is increased. When the number of dummy memory cells decreases, the size of the memory block BLKb decreases. On the other hand, the reliability of an operation of the memory block BLKb may be deteriorated.

In order to efficiently control the at least one dummy memory cell, the dummy memory cells may have a required threshold voltage. Before or after an erase operation of the memory block BLKb, a program operation may be performed on all or some of the dummy memory cells. When an erase operation is performed after the program operation is performed, the threshold voltage of the dummy memory cells control a voltage applied to the dummy word lines connected to the respective dummy memory cells, so that the dummy memory cells can have the required threshold voltage.

Figure 7:
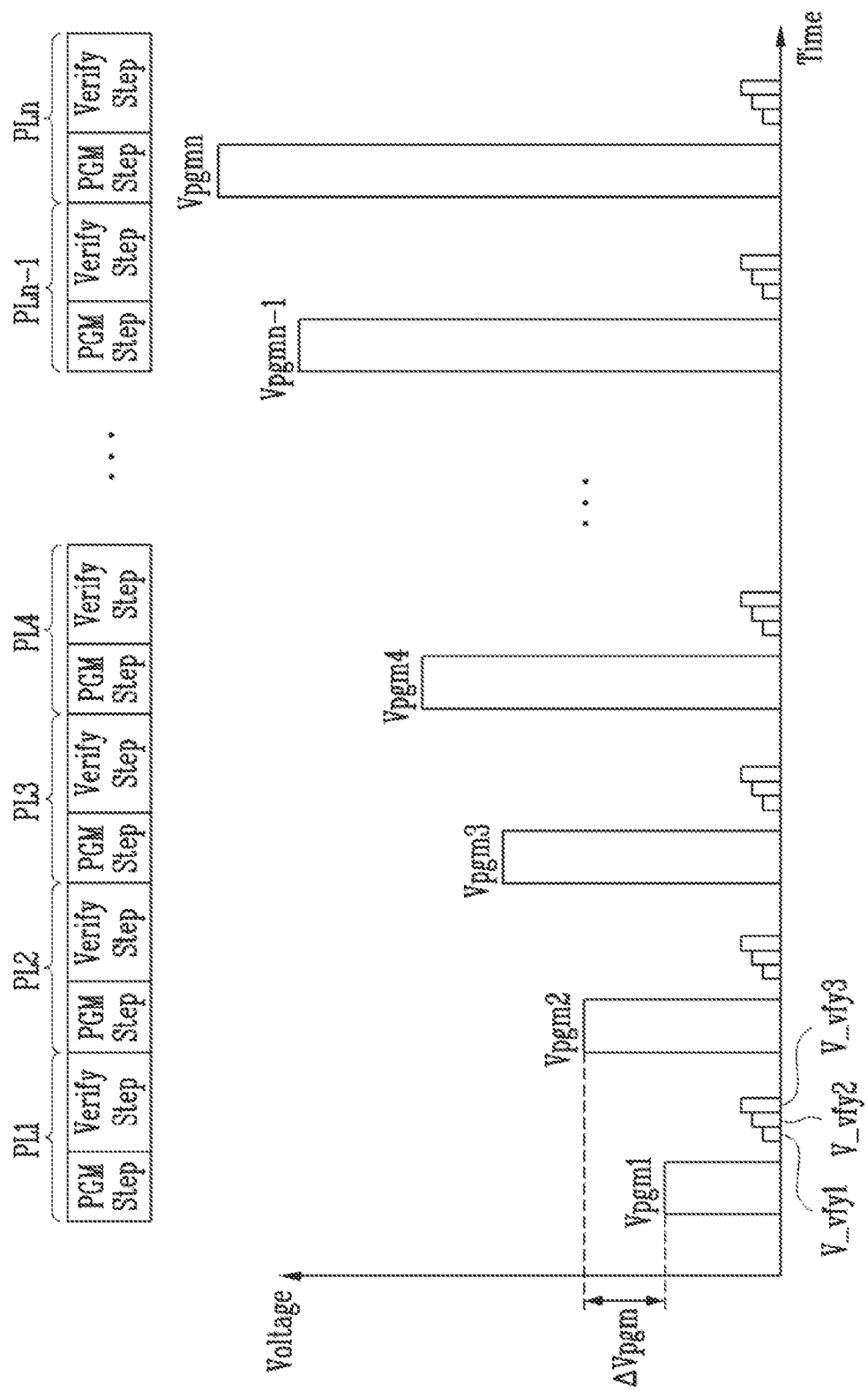
FIG. 7 is a diagram illustrating a program operation of the memory device shown in FIG. 2.

FIG. 7 is a diagram illustrating a program operation of the memory device shown in FIG. 2.

In FIG. 7, for convenience of description, it is assumed that each of a plurality of memory cells is a Multi-Level Cell (MLC) storing 2-bit data. However, the scope of the present disclosure is not limited thereto, and each of the plurality of memory cells may be a Triple Level Cell (TLC) storing 3-bit data or a Quadruple Level Cell (QLC) storing 4-bit data.

The program operation of the memory device 100 may include a plurality of program loops PL1 to PLn. That is, the memory device 100 may program selected memory cells to have a threshold voltage corresponding to any one state among a plurality of program states P1, P2, and P3 by performing the plurality of program loops PL1 to PLn.

Each of the plurality of program loops PL1 to PLn may include a program operation PGM step of applying a program voltage to a selected word line connected to the selected memory cells and a verify operation Verify Step of determining whether memory cells have been programmed by applying verify voltages.

For example, when a first program loop PL1 is performed, first to third verify voltages V_vfy1 to V_vfy3 are sequentially applied to verify a program state of the plurality of memory cells after a first program pulse Vpgm1 is applied. Memory cells of which a target program state is a first program state P1 may be verified by the first verify voltage V_vfy1, memory cells of which a target program state is a second program state P2 may be verified by the second verify voltage V_vfy2, and memory cells of which a target program state is a third program state P3 may be verified by the third verify voltage V_vfy3.

The memory cells verify-passed by each of the verify voltages V_vfy1 to V_vfy3 may be determined that the memory cells have the target program state, and then be program-inhibited in a second program loop PL2. A second program pulse Vpgm2 higher by a unit voltage ΔVpgm than the first program pulse Vpgm1 is applied so as to program the other memory cells except the program-inhibited memory cells in the second program loop PL2. Subsequently, a verify operation is performed identically to that of the first program loop PL1. For example, the term "verify-passed" means that a memory cell is read as an off-cell by a corresponding verify voltage.

As described above, when the memory device 100 programs the MLC storing 2 bits, the memory device verify memory cells having various program states as target program states respectively by using the first to third verify voltages V_vfy1 to V_vfy3.

In the verify operation, a verify voltage may be applied to the selected word line as a word line connected to the selected memory cells, and the page buffer shown in FIG. 2 may determine whether the selected memory cells have been verify-passed, based on a current or voltage flowing through bit lines respectively connected to the selected memory cells.

Figure 8:
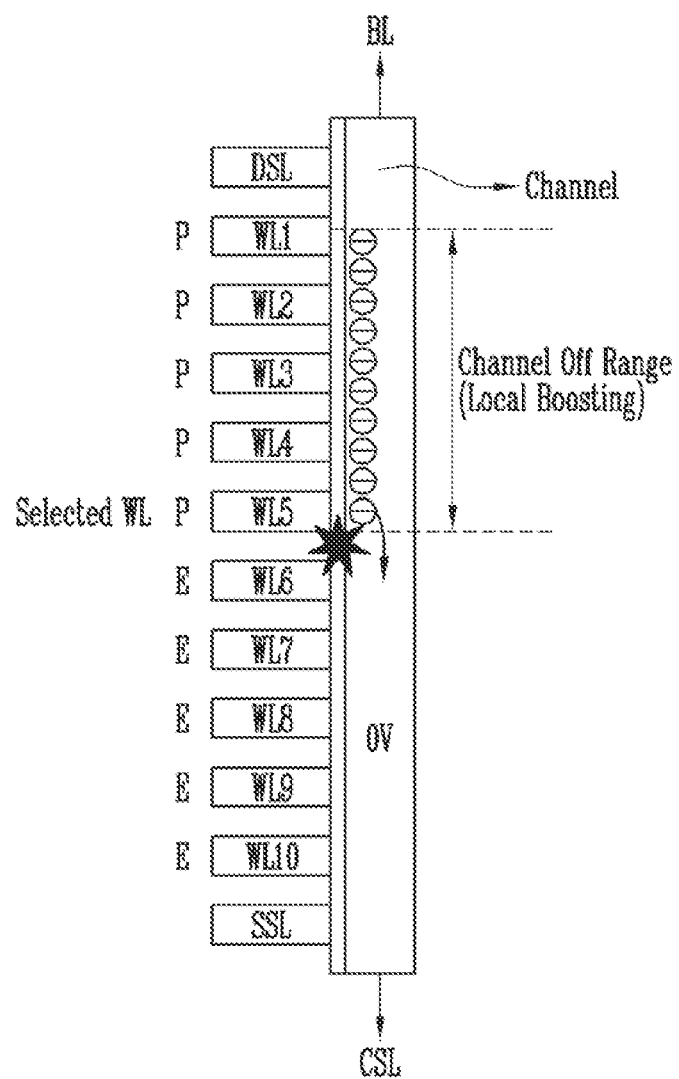
FIG. 8 is a diagram illustrating a drop of a channel voltage of a memory cell string.

FIG. 8 is a diagram illustrating a drop of a channel voltage of a memory cell string.

In FIG. 8, the memory cell string may include a plurality of memory cells connected in series between a bit line BL and a common source line CSL. The memory cells may be respectively connected to word lines. A drain select transistor may be connected between the memory cells and the bit line BL, and a source select transistor may be connected between the memory cells and the common source line CSL. The drain select transistor may be controlled through a drain select line DSL, and the source select transistor may be controlled through a source select line SSL.

In an embodiment, it is assumed that the memory cell string is connected to 10 word lines WL1 to WL10, and the program operation is sequentially performed in a direction from a first word line WL1 to a tenth word line WL10. In other words, the program operation may be sequentially performed in a direction from the drain select line DSL to the source select line. A selected word line is a fifth word line WL5. Therefore, memory cells connected to first to fourth word lines WL1 to WL4 are programmed memory cells, and memory cells connected to sixth to tenth word lines WL6 to WL10 are memory cells before the memory cells are programmed. Thus, the memory cells connected to the sixth to tenth word lines WL6 to WL10 may have a threshold voltage corresponding to an erase state E. Accordingly, a channel-off period, i.e., a local boosting region may be formed in a channel corresponding to memory cells connected to the first to fifth word lines WL1 to WL5. The memory cells connected to the first to fifth word lines WL1 to WL5 may have a threshold voltage corresponding to a programmed state P.

After the verify operation described with reference to FIG. 7, the word lines are discharged to a ground voltage. Accordingly, charges of the channel-off period may undergo negative down-coupling. This is referred to as negative boosting or under coupling. Therefore, the number of negative charges included in the channel-off period may increase.

Since a channel corresponding to the memory cells connected to the sixth to tenth word lines WL6 to WL10 is in a state in which the channel is connected to the common source line CSL, a voltage of the channel may be the ground voltage (0V). Therefore, since the voltage difference between a negative voltage of the channel-off period and the ground voltage (0V) increases, memory cells corresponding to the erase state E may be programmed by band to band tunneling (BTBT) or hot carrier injection (HCI). Accordingly, a channel precharge operation of increasing a potential of the channel through the common source line CSL by controlling the source select line SSL may be performed to prevent the memory cells corresponding to the erase state E from being programmed.

The channel precharge operation may be an operation of precharging the channel through the common source line between a verify operation of a current program loop and a program operation of a next program loop.

In the embodiment of the present disclosure, the channel precharge operation can be performed to prevent a potential of the channel of the memory cells corresponding to the erase state E from being dropped and to maintain the potential of the channel at a constant level. The potential of the channel of the memory cells corresponding to the erase state E is maintained at the constant level through the channel precharge operation, so that disturbance due to FN tunneling in the program operation can be prevented.

Figure 9:
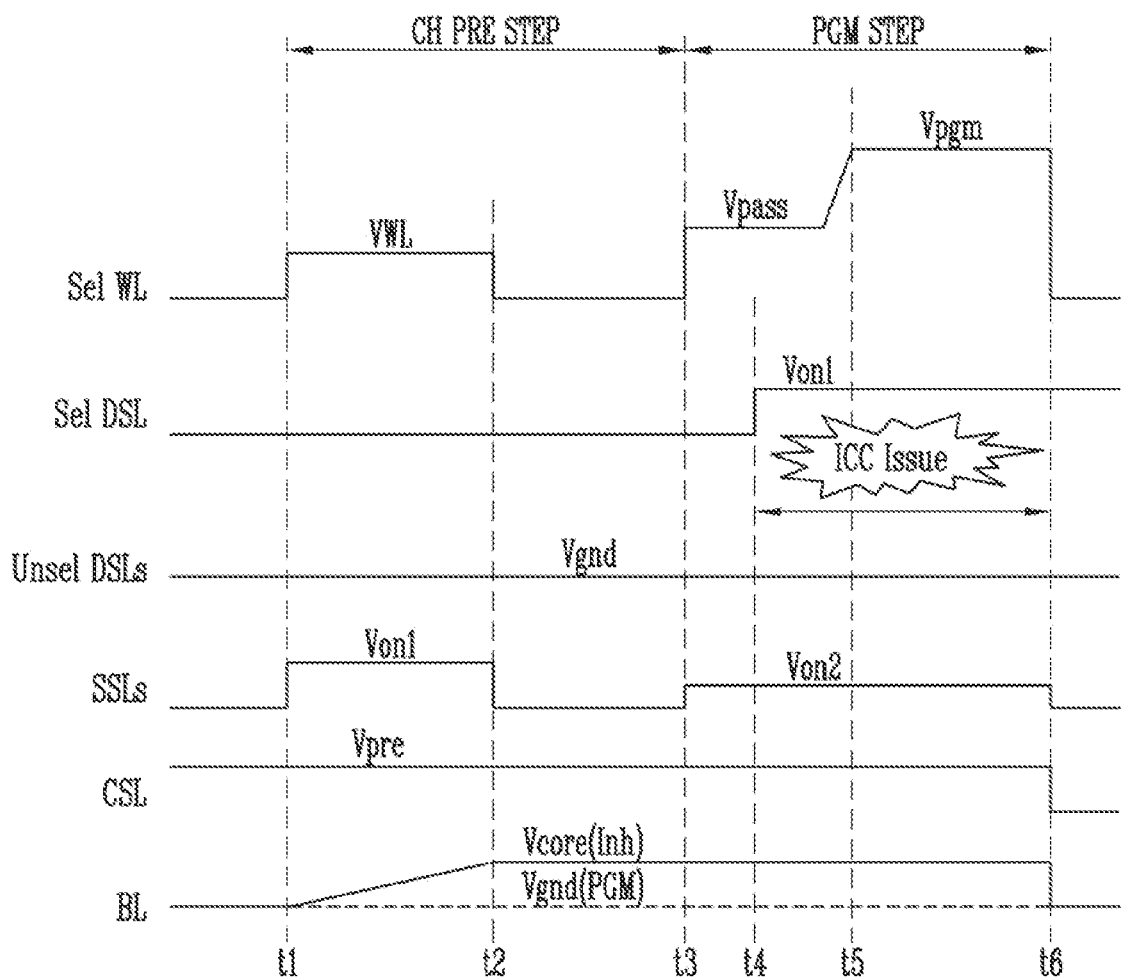
FIG. 9 is a timing diagram illustrating an operation of the memory device in accordance with an embodiment of the present disclosure.

FIG. 9 is a timing diagram illustrating an operation of the memory device in accordance with an embodiment of the present disclosure.

Referring to FIG. 9, at t1 to t3, a channel precharge operation may be performed (i.e., CH PRE STEP). At t3 to t6, a program operation may be performed (i.e., PGM STEP).

At t1 to t2, a word line voltage VWL may be applied to a selected word line Sel WL among a plurality of word lines. The word line voltage VWL may be higher than or equal to a ground voltage Vgnd and be lower than a pass voltage Vpass. At t2 to t3, the ground voltage Vgnd may be applied to the selected word line Sel WL.

At t1, the ground voltage Vgnd may be applied to a selected drain select line Sel DSL connected to a selected memory cell string among a plurality of memory cell strings.

At t1, the ground voltage Vgnd may be applied to unselected drain select lines Unsel DSLs connected to unselected memory cell strings among the plurality of memory cell strings.

At t1 to t2, a first turn-on voltage Von1 may be applied to source select lines SSLs connected to the plurality of memory cell strings. At t2 to t3, the ground voltage Vgnd may be applied to the source select lines SSLs.

From before t1, a precharge voltage Vpre may be applied to a common source line CSL.

At t1 to t2, a bit line setup operation of setting a bit line voltage as a power voltage Vcore or the ground voltage Vgnd may be performed according to whether a selected memory cell of a memory cell string connected to a bit line is a program target cell or a program inhibit cell.

In an embodiment, while the source select lines SSLs are turned on at t1 to t2, a channel voltage may be boosted since the precharge voltage Vpre applied to the common source line CSL is transferred to a channel region of the memory cell string. While the source select lines SSLs are turned off at t2 to t3, the channel voltage may be dropped since the precharge voltage Vpre transferred to the channel region of the memory cell string through the common source line CSL is blocked. In other words, the potential of the channel of the memory cell string is dropped, and therefore, disturbance due to FN tunneling in the program operation may occur.

At t3, the pass voltage Vpass may be applied to the selected word line Sel WL. The pass voltage may be applied to unselected word lines (not shown) among the plurality of word lines. The selected word line Sel WL and the unselected word lines are simultaneously increased to a pass voltage level, so that an interference effect due to a voltage difference between word lines can be minimized. The words "simultaneous" and "simultaneously" as used herein with respect to occurrences mean that the occurrences take place on overlapping intervals of time. For example, if a first occurrence takes place over a first interval of time and a second occurrence takes place simultaneously over a second interval of time, then the first and second intervals at least partially overlap each other such that there exists a time at which the first and second occurrences are both taking place.

After t3, a program voltage Vpgm may be applied to the selected word line Sel WL.

At t5 to t6, the potential of the selected word line Sel WL may be maintained at a program voltage Vpgm level.

At t4, the first turn-on voltage Von1 may be applied to the drain select line Sel DSL connected to the selected memory cell string.

At t3, a second turn-on voltage Von2 may be applied to the source select lines SSLs connected to the plurality of memory cell strings.

Each of the first turn-on voltage Von1 and the second turn-on voltage Von2 may be a voltage for turning on a select transistor to which the voltage is applied. The second turn-on voltage Von2 may be lower than the first turn-on voltage Von1.

In an embodiment, the first turn-on voltage Von1 may be a voltage for fully turning on the select transistor. The second turn-on voltage Von2 may be a voltage for slightly turning on the select transistor.

In an embodiment, during t4 to t6, the source select lines SSLs may be slightly turned on, and the selected drain select line Sel DSL connected to the selected memory cell string may be fully turned on.

Therefore, in the case of the selected memory cell string, a drain select transistor and a source select transistor are in a state in which both the drain select transistor and the source select transistor are turned on, and therefore, a short current may flow. The short current may cause an internal circuit current (ICC) issue.

Figure 10A:
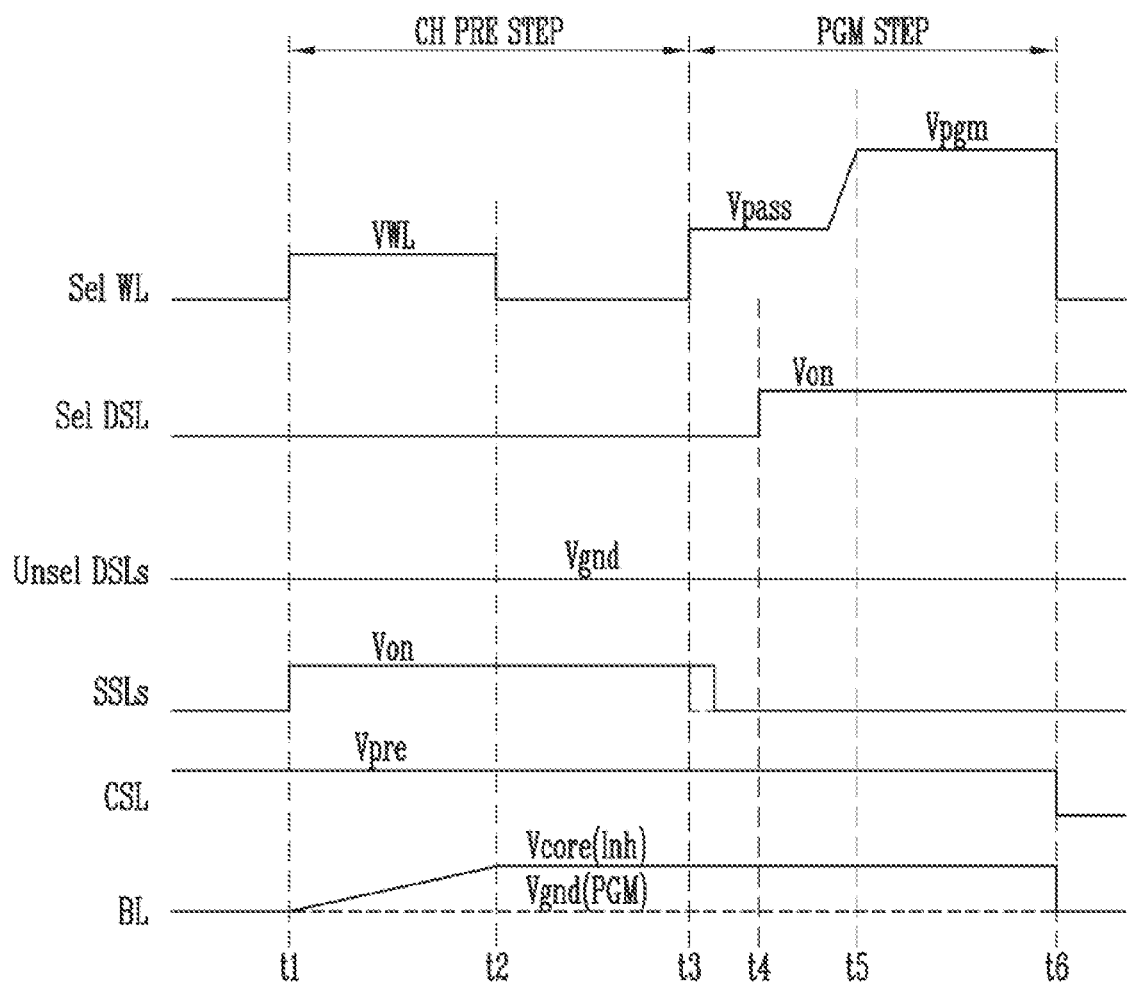
FIG. 10A is a timing diagram illustrating an operation of the memory device in accordance with an embodiment of the present disclosure.

FIG. 10A is a timing diagram illustrating an operation of the memory device in accordance with an embodiment of the present disclosure.

Referring to FIG. 10A, as compared with FIG. 9, signals applied to the other lines except the source select lines SSLs connected to the plurality of memory cell strings and the selected drain select line Sel DSL connected to the selected memory cell string may be described identically to those shown in FIG. 9.

At t1 to t3, a turn-on voltage Von may be applied to the source select lines SSLs. In an embodiment, the turn-on voltage Von may be a voltage for fully turning on the select transistor.

While the source select line SSLs are turned on at t1 to t3, the channel voltage may be boosted since the precharge voltage Vpre applied to the common source line CSL is transferred to the channel region of the memory cell string.

As compared with FIG. 9, at t2 to t3, the source select lines SSLs are turned on, and the channel voltage is maintained at a precharge voltage Vpre level. Thus, an effect of reducing negative channel boosting can be enhanced.

t3 to t4 may correspond to a period in which the pass voltage Vpass is applied to the selected word line Sel WL.

In an embodiment, the turn-on voltage Von may be applied to the source select lines SSLs during a portion of the period in which the pass voltage Vpass is applied to the selected word line Sel WL. The period in which the turn-on voltage Von is applied to the source select lines SSLs may include a time t3 at which the pass voltage Vpass is applied to the selected word line Sel WL. The ground voltage Vgnd may be applied to the source select lines SSLs, after the period in which the turn-on voltage Von is applied to the source select line SSLs in the period in which the pass voltage Vpass is applied to the selected word line Sel WL.

In another embodiment, at t3, the ground voltage Vgnd may be applied to the source select lines SSLs.

At t4, the turn-on voltage Von may be applied to the selected drain select line Sel DSL connected to the selected memory cell string.

As compared with FIG. 9, at t3 to t4, the turn-on voltage Von may be applied to the selected drain select line Sel DSL connected to the selected memory cell string, after the ground voltage Vgnd is applied to the source select lines SSLs.

Thus, since the source select transistor is in a turn-off state when the drain select transistor is in a turn-on state, any short current does not flow through the selected memory cell string, and the internal circuit current (ICC) issue can be minimized.

Figure 10B:
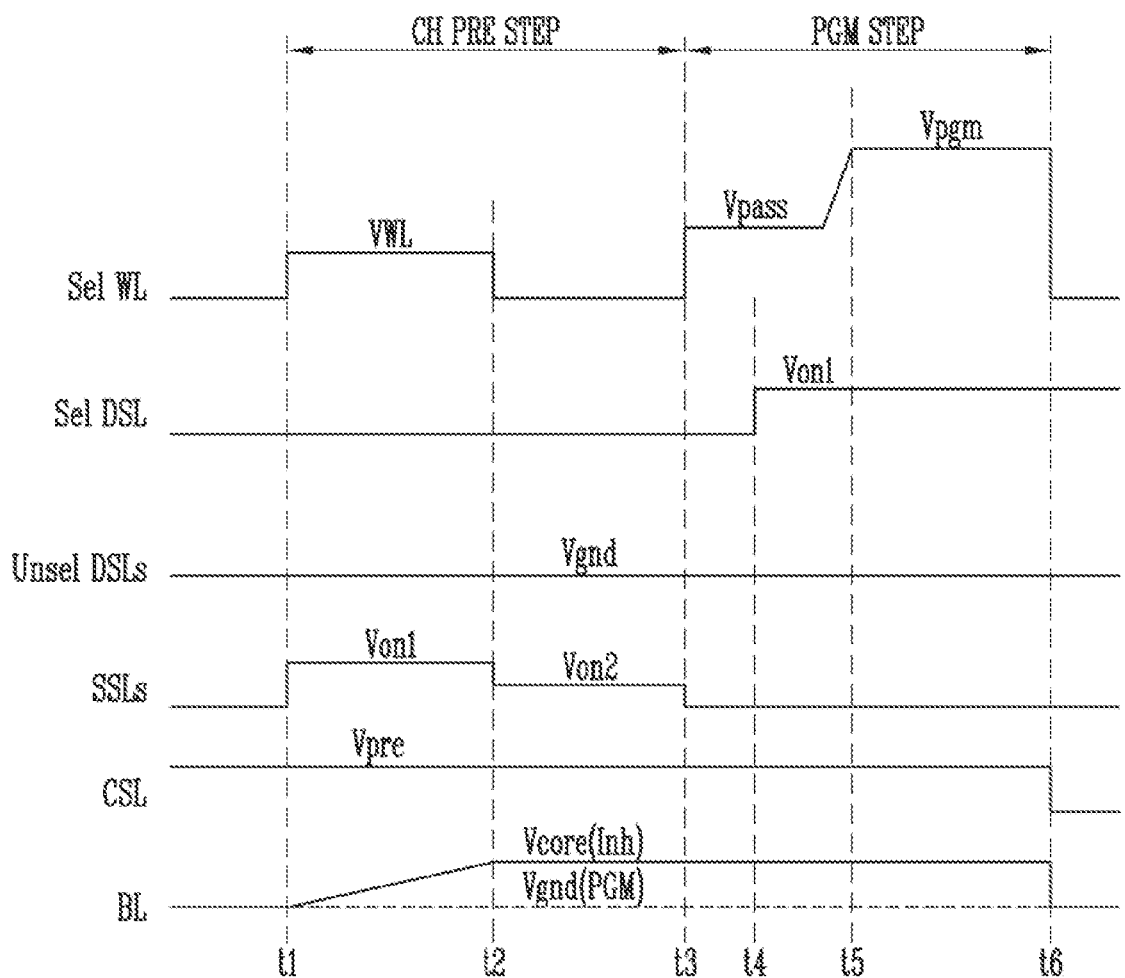
FIG. 10B is a timing diagram illustrating an operation of the memory device in accordance with an embodiment of the present disclosure.

FIG. 10B is a timing diagram illustrating an operation of the memory device in accordance with an embodiment of the present disclosure.

Referring to FIG. 10B, as compared with FIG. 10A, a voltage applied to the source select lines SSLs connected to the plurality of memory cell strings may be different that shown in FIG. 10A.

In FIG. 10B, ti to t3 may be divided into two periods. Therefore, a first turn-on voltage Von1 may be applied to the source select lines SSLs at t1 to t2, and a second turn-on voltage Von2 may be applied to the source select lines SSLs at t2 to t3.

In an embodiment, the first turn-on voltage Von1 may be a voltage for fully turning on the select transistor. The second turn-on voltage Von2 may be a voltage for slightly turning on the select transistor. The second turn-on voltage Von2 may be lower than the first turn-on voltage Von1. The turn-on voltage Von and the first turn-on voltage Von1 may be at the same level.

As compared with FIG. 9, since the source select lines SSLs are in a state in which the source select lines SSLs are slightly turned on, a drop of the channel voltage of the memory cell string is prevented, and the effect of reducing negative channel boosting can be enhanced.

At t3, the ground voltage Vgnd may be applied to the source select lines SSLs.

At t4, the first turn-on voltage Von1 may be applied to the selected drain select line Sel DSL connected to the selected memory cell string.

As compared with FIG. 9, at t3 to t4, the first turn-on voltage Von1 may be applied to the selected drain select line Sel DSL connected to the selected memory cell string, after the ground voltage Vgnd is applied to the source select lines SSLs.

Thus, since the source select transistor is in the turn-off state when the drain select transistor is in the turn-on state, any short current does not flow through the selected memory cell string, and the internal circuit current (ICC) issue can be minimized.

Figure 11:
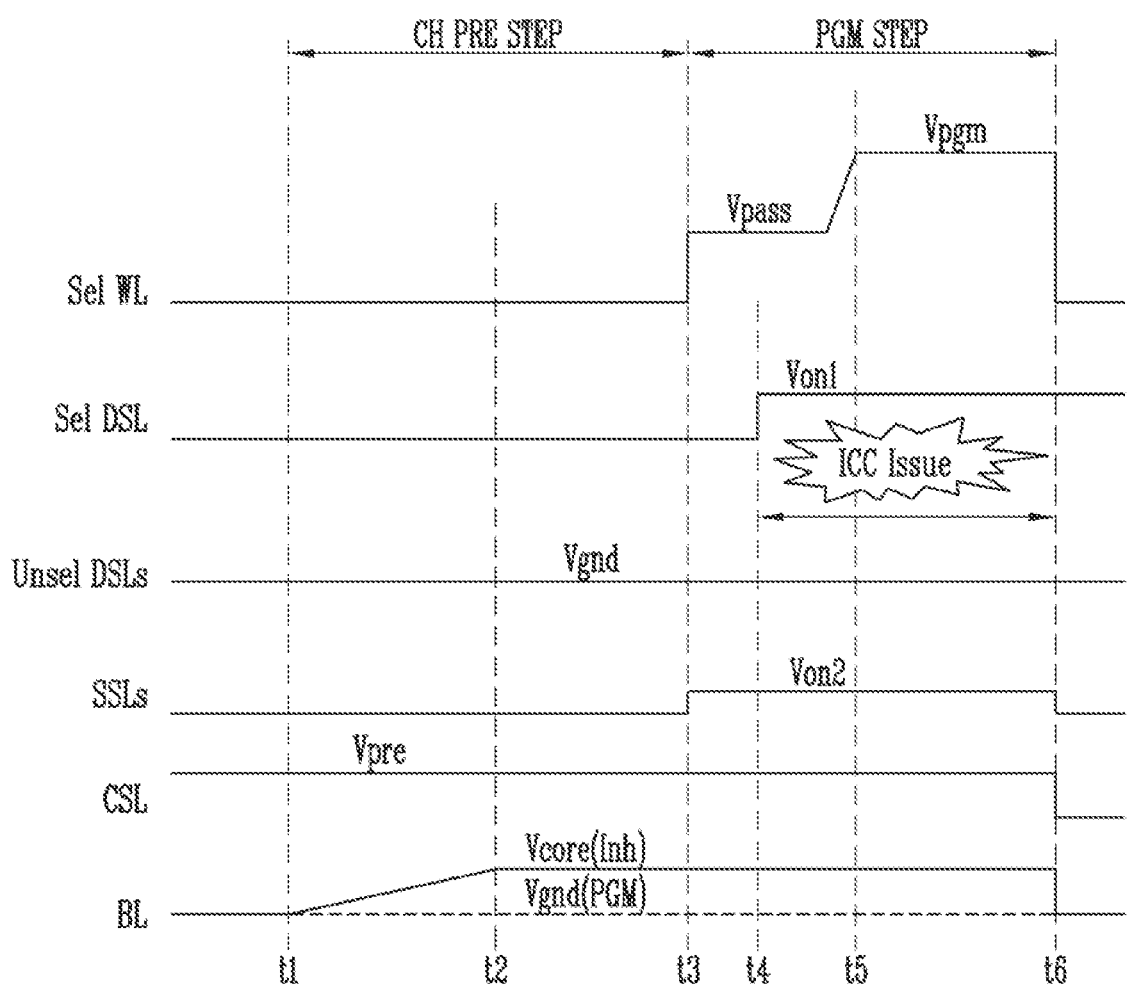
FIG. 11 is a timing diagram illustrating an operation of the memory device in accordance with an embodiment of the present disclosure.

FIG. 11 is a timing diagram illustrating an operation of the memory device in accordance with an embodiment of the present disclosure.

Referring to FIG. 11, as compared with FIG. 9, at t1 to t2, the ground voltage Vgnd may be applied to the selected word line Sel WL. The ground voltage Vgnd may be applied to the source select lines SSLs.

Therefore, at t1 to t3, since the channel voltage of the memory cell string is not increased, the voltage of the channel of the memory cell string may be dropped.

At t3 to t4, the second turn-on voltage Von2 may be applied to the source select lines SSLs, and the precharge voltage Vpre is applied to the common source line CSL. Therefore, the channel voltage of the memory cell string may be boosted.

During t4 to t6, the source select lines SSLs may be slightly turned on, and the selected drain select line Sel DSL connected to the selected memory cell string may be fully turned on.

Therefore, in the case of the selected memory cell string, both the drains select transistor and the source select transistor are in the turn-on state, and therefore, a short current may flow. The short current may causes an internal circuit current (ICC) issue.

Figure 12:
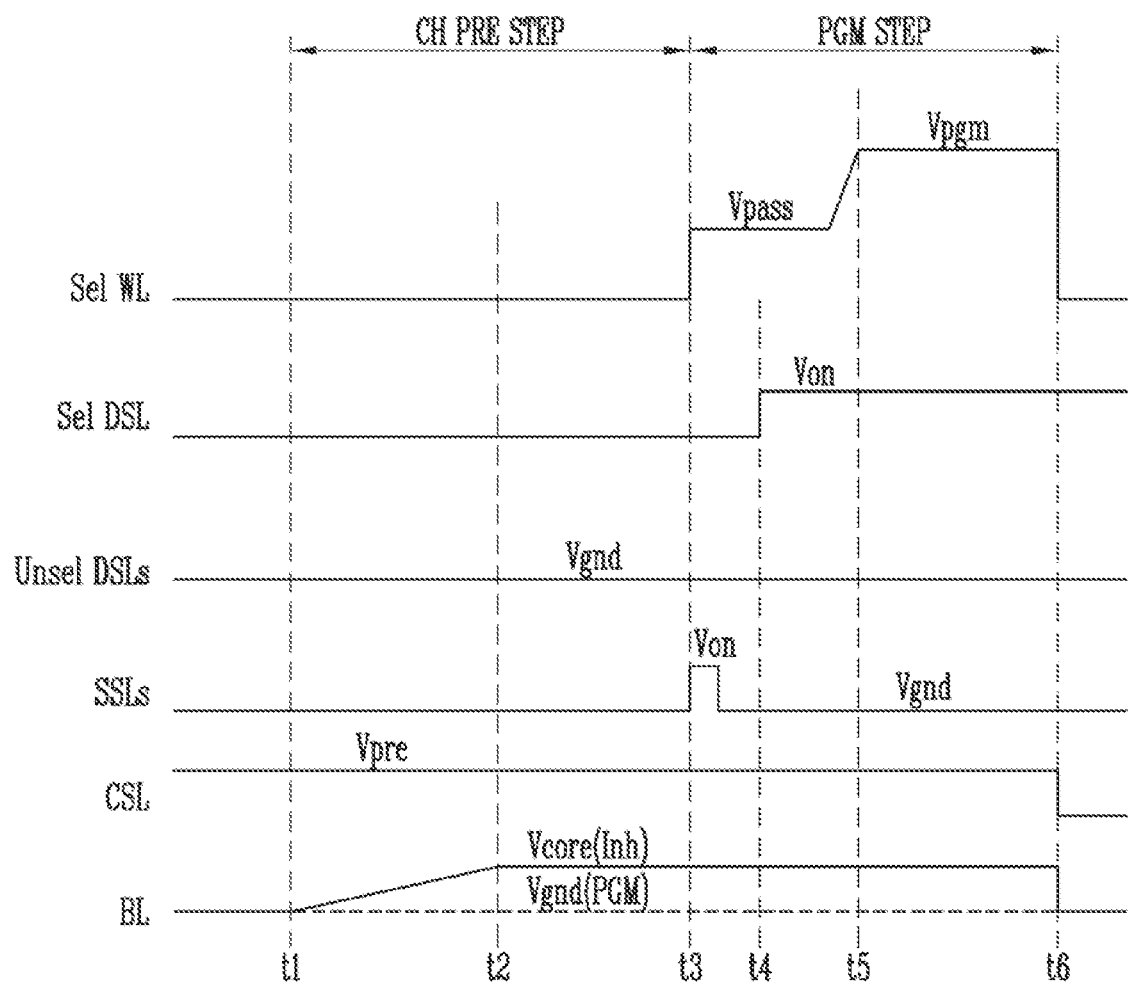
FIG. 12 is a timing diagram illustrating an operation of the memory device in accordance with an embodiment of the present disclosure.

FIG. 12 is a timing diagram illustrating an operation of the memory device in accordance with an embodiment of the present disclosure.

Referring to FIG. 12, t3 to t4 may correspond to a period in which the pass voltage Vpass is applied to the selected word line Sel WL.

As compared with FIG. 11, the turn-on voltage Von may be applied to the source select lines SSLs during a portion of the period in which the pass voltage Vpass is applied to the selected word line Sel WL. The period in which the turn-on voltage Von is applied to the source select lines SSLs may include a time t3 at which the pass voltage Vpass is applied to the selected word line Sel WL. The ground voltage Vgnd may be applied to the source select lines SSLs, after the period in which the turn-on voltage Von is applied to the source select lines SSLs in the period in which the pass voltage Vpass is applied to the selected word line Sel WL.

At t4, the turn-on voltage Von may be applied to the selected drain select line Sel DSL connected to the selected memory cell string.

As compared with FIG. 11, at t3 to t4, the turn-on voltage Von may be applied to the selected drain select line Sel DSL connected to the selected memory cell string, after the ground voltage Vgnd is applied to the source select line SSLs.

Thus, since the source select transistor is in the turn-off state when the drain select transistor is in the turn-on state, any short current does not flow through the selected memory cell string, and the internal circuit current (ICC) issue can be minimized.

Figure 13:
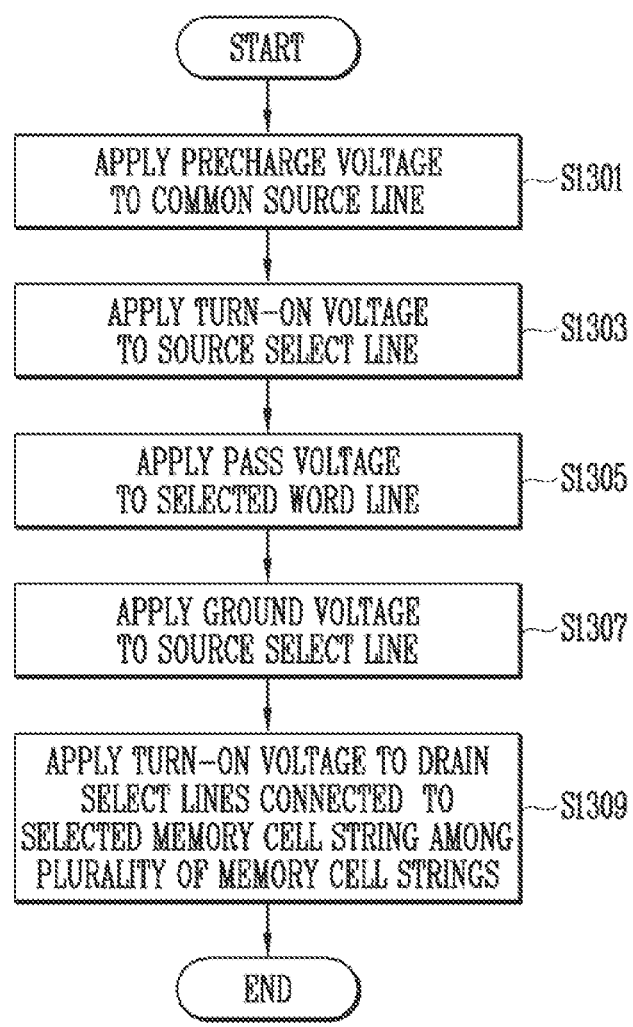
FIG. 13 is a flowchart illustrating an operation of the memory device in accordance with an embodiment of the present disclosure.

FIG. 13 is a flowchart illustrating an operation of the memory device in accordance with an embodiment of the present disclosure.

Referring to FIG. 13, in step S1301, the memory device may apply a precharge voltage to a common source line connected to a plurality of memory cell strings.

In step S1303, the memory device may apply a turn-on voltage to source select lines connected to the plurality of memory cell strings.

In step S1305, the memory device may apply a pass voltage to a selected word line among a plurality of word lines connected to the plurality of memory cell strings.

In step S1307, the memory device may apply a ground voltage to the source select lines connected to the plurality of memory cell strings.

In step S1309, the memory device may apply the turn-on voltage to selected drain select lines connected to a selected memory cell string among the plurality of memory cell strings.

In an embodiment, in a state in which the common source line is precharged to the precharge voltage, source select lines which were in the turn-on state are turned off in the period in which the pass voltage is applied to the selected word line, so that a channel potential of the memory cell string in a program operation can be maintained at a constant level. The channel potential of the memory cell string may be determined based on the precharge voltage applied to the common source line. In addition, after the source select lines are turned off, the selected drain select line connected to selected memory cell string is turned on, so that the internal circuit current (ICC) issue can be minimized.

In accordance with the present disclosure, there can be provided a memory device having improved channel voltage drop prevention performance and an operating method of the memory device.

While the present disclosure has been shown and described with reference to certain examples of embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described examples of embodiments but should be determined by not only the appended claims but also the equivalents thereof.

In the above-described embodiments, all steps may be selectively performed or part of the steps may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the examples of embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A method for operating a memory device including a plurality of memory cell strings connected between a bit line and a common source line, the method comprising:
   applying a pass voltage to a selected word line among a plurality of word lines connected to the plurality of memory cell strings; and
   applying a turn-on voltage to a source select line connected to the plurality of memory cell strings, during a portion of a period in which the pass voltage is applied to the selected word line.

2. The method of claim 1, further comprising applying a ground voltage to the source select line, after a period in which the turn-on voltage is applied to the source select line in the period in which the pass voltage is applied to the selected word line.

3. The method of claim 2, further comprising applying the turn-on voltage to a selected drain select line connected to a selected memory cell string among the plurality of memory cell strings, after the ground voltage is applied to the source select line.

4. The method of claim 2, wherein the period in which the turn-on voltage is applied to the source select line includes a time at which the pass voltage is applied to the selected word line.

5. The method of claim 1, further comprising applying a program voltage to the selected word line, after the applying of the pass voltage to the selected word line.

6. The method of claim 1, further comprising applying a precharge voltage to the common source line, before the applying of the pass voltage to the selected word line.

7. The method of claim 6, further comprising applying a ground voltage to the source select line, while the precharge voltage is being applied to the common source line.

8. The method of claim 6, further comprising applying the turn-on voltage to the source select line, while the precharge voltage is being applied to the common source line.

9. The method of claim 6, further comprising:
   while the precharge voltage is being applied to the common source line,
   applying a word line voltage to the selected word line; and
   applying a ground voltage to the selected word line, after the word line voltage is applied to the selected word line.

10. The method of claim 9, wherein the applying of the turn-on voltage to the source select line includes:
    applying a first turn-on voltage to the source select line, while the word line voltage is being applied to the selected word line; and
    applying a second turn-on voltage lower than the first turn-on voltage to the source select line, while the ground voltage is being applied to the selected word line.

11. The method of claim 9, wherein the word line voltage is higher than or equal to the ground voltage and is lower than the pass voltage.

12. The method of claim 1, wherein each of the plurality of memory cell strings includes:
    a drain select transistor connected to the bit line;
    a source select transistor connected to the common source line; and
    a plurality of memory cells connected between the drain select transistor and the source select transistor, and
    wherein the turn-on voltage is a voltage for turning on at least one of the drain select transistor and the source select transistor.

13. A memory device comprising:
    a plurality of memory cell strings connected between a bit line and a common source line;
    a peripheral circuit configured to perform a channel precharge operation and a program operation for the plurality of memory cell strings; and
    control logic configured to control the peripheral circuit to apply a pass voltage to a selected word line among a plurality of word lines connected to the plurality of memory cell strings and to apply a turn-on voltage to a source select line connected to the plurality of memory cell strings, during a portion of a period in which the pass voltage is applied to the selected word line, in the program operation.

14. The memory device of claim 13, wherein the control logic controls the peripheral circuit to apply a ground voltage to the source select line, after a period in which the turn-on voltage is applied to the source select line, and then to apply the turn-on voltage to a selected drain select line connected to a selected memory cell string among the plurality of memory cell strings, in the period in which the pass voltage is applied to the selected word line.

15. The memory device of claim 13, wherein the control logic controls the peripheral circuit to apply a precharge voltage to the common source line and to apply the turn-on voltage to the source select line, in the channel precharge operation.

16. The memory device of claim 15, wherein the control logic controls the peripheral circuit to apply a word line voltage to the selected word line, during a portion of a period in which the precharge voltage is applied to the common source line.

17. The memory device of claim 16, wherein the word line voltage is higher than or equal to a ground voltage and is lower than the pass voltage.

18. The memory device of claim 16, wherein the control logic controls the peripheral circuit:
    to apply a first turn-on voltage to the source select line, during a period in which the word line voltage is applied to the selected word line in the period in which the precharge voltage is applied to the common source line; and
    to apply a second turn-on voltage lower than the first turn-on voltage, during the other period except the period in which the word line voltage is applied to the selected word line in the period in which the precharge voltage is applied to the common source line.

19. The memory device of claim 13, wherein each of the plurality of memory cell strings includes:
    a drain select transistor connected to the bit line;
    a source select transistor connected to the common source line; and
    a plurality of memory cells connected between the drain select transistor and the source select transistor, and
    wherein the turn-on voltage is a voltage for turning on at least one of the drain select transistor and the source select transistor.

20. The memory device of claim 13, wherein the control logic controls the peripheral circuit to apply a program voltage, after the pass voltage is applied to the selected word line.

* * * * *